(12) United States Patent
Mikolajick

(10) Patent No.: US 6,724,038 B2
(45) Date of Patent: Apr. 20, 2004

(54) MEMORY ELEMENT FOR A SEMICONDUCTOR MEMORY DEVICE

(75) Inventor: Thomas Mikolajick, Dresden (DE)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 10/223,955

(22) Filed: Aug. 20, 2002

(65) Prior Publication Data

US 2003/0038312 A1 Feb. 27, 2003

(30) Foreign Application Priority Data

Aug. 20, 2001 (DE) .......................................... 101 40 758

(51) Int. Cl.$^7$ ............................................. H01L 29/792
(52) U.S. Cl. ......................................................... 257/324
(58) Field of Search ................................. 257/314–326; 438/257–265

(56) References Cited

U.S. PATENT DOCUMENTS

| | | | |
|---|---|---|---|
| 5,714,766 A | | 2/1998 | Chen et al. |
| 5,740,104 A | | 4/1998 | Forbes |
| 5,874,761 A | * | 2/1999 | Nakao ........................ 257/325 |
| 6,128,243 A | | 10/2000 | Chan et al. |
| 6,137,718 A | * | 10/2000 | Reisinger .................... 257/324 |
| 6,172,905 B1 | | 1/2001 | White et al. |
| 6,498,377 B1 | * | 12/2002 | Lin et al. .................... 257/424 |
| 6,518,617 B1 | * | 2/2003 | Nakamura et al. .......... 257/314 |
| 6,541,816 B2 | * | 4/2003 | Ramsbey et al. ............ 257/324 |

FOREIGN PATENT DOCUMENTS

| | | |
|---|---|---|
| EP | 1 103 980 A2 | 5/2001 |
| GB | 2157489 A | 10/1985 |
| WO | 01/13378 | 2/2001 |

OTHER PUBLICATIONS

Hussein I Hanafi et al.: "Fast and Long Retention–Time Nano–Crystal Memory", *IEEE Transactions on Electron Devices*, vol. 43, No. 9, Sep. 1996, pp. 1553–1558.

Boaz Eitan et al.: "NROM: A Novel Localized Trapping, 2–Bit Nonvolatile Memory Cell", *IEEE Electron Device Letters*, vol. 21, No. 11, Nov. 2000, pp. 543–545.

Martino Lorenzini et al.: "A Dual Gate Flash EEPROM Cell with 2–Bit Storage Capacity", *IEEE Transactions on Components, Packaging, and Manufacturing Technology*, Part A, vol. 20, No. 2, Jun. 1997, pp. 182–189.

G. Iannaccone et al.: "Three–Dimensional simulation of nanocrystal Flash memories", *Applied Physics Letters*, vol. 78, No. 14, Apr. 2, 2001, pp. 2046–2048.

David Lammers: "Moto lab builds 4–Mbit 'nanocrystal' memory", *EE Times*, Mar. 31, 2003, 2 pp., http://www.ee-times.com/story/OEG20030331S0023.

\* cited by examiner

*Primary Examiner*—Cuong Nguyen
(74) *Attorney, Agent, or Firm*—Laurence A. Greenberg; Werner H. Stemer; Ralph E. Locher

(57) ABSTRACT

A memory element includes a number of material areas isolated from one another to form at least one area with changed electrical and/or magnetic characteristics in an isolation area, which material areas have or form free charge carriers. An information unit can correspondingly be written to, deleted, and/or read from by influencing the material areas by applying an electrical potential to line devices that are provided in areas.

26 Claims, 2 Drawing Sheets

MEMORY ELEMENT FOR A SEMICONDUCTOR MEMORY DEVICE

BACKGROUND OF THE INVENTION

Field of the Invention

The invention relates to a memory element for a semiconductor memory device, in particular, a multibit memory cell, or the like.

There exist memory elements for semiconductor memory devices, in which a change is made from the basic structure, the memory elements having a storage capacitor and a selection transistor that is physically isolated from the capacitor for information storage.

In such memory elements for semiconductor memory devices, a number of line devices are provided that are substantially electrically insulated from one another in pairs, are formed in a semiconductor substrate of a first conductance type or in a surface area thereof, and are at least partially formed and disposed physically separated from one another in pairs by an intermediate area of the semiconductor substrate. Furthermore, an isolation area is provided there, which is composed of an substantially electrically insulating material that makes mechanical and electrical contact with the intermediate area, and in each case with an overlap area of each line device. In such a case, by applying to the line devices, in particular, to their overlap areas, and to the isolation area an electrical potential distribution in the isolation area in accordance with an information unit that is to be stored, it is possible, at least temporarily, to form at least one area with changed electrical and/or magnetic characteristics.

Conventional memory elements of this type are subject to the problem that the isolation area allows only an substantially physically cohesive change to the electrical and/or magnetic characteristics in the isolation area so that it is impossible to satisfactorily ensure strict physical isolation between the stored information contents, or information contents to be stored, and, hence, cross-talk between information contents that need to be distinguished, for example, a number of bits.

SUMMARY OF THE INVENTION

It is accordingly an object of the invention to provide a memory element for a semiconductor memory device that overcomes the hereinafore-mentioned disadvantages of the heretofore-known devices of this general type and that ensures adequate discrimination between stored information contents in the memory element in a simple manner.

With the foregoing and other objects in view, there is provided, in accordance with the invention, a memory element for a semiconductor memory device, including a semiconductor substrate of a first conductance type having a surface area, an intermediate area, and a number of line devices formed one of in the semiconductor substrate and in the surface area, the line devices substantially electrically insulated from one another in pairs and at least partially formed and disposed physically separated from one another in pairs by the intermediate area, an isolation area of an substantially electrically insulating material, the isolation area mechanically and electrically contacted with the intermediate area, and each of the line devices at a respective overlap area of each of the line devices, the isolation area having a number of material areas isolated from one another to form at least one area with at least one of changed electrical characteristics and changed magnetic characteristics in the isolation area, at least one of each of the material areas having free charge carriers and each of the material areas being able to have free charge carriers formed therein, and the line devices and the isolation area at least temporarily forming the at least one area when an electrical potential distribution is applied to the line devices and to the isolation area in the isolation area in accordance with an information unit that is to be stored. In the memory element, the overlap areas and the isolation area can at least temporarily form the at least one area when an electrical potential distribution is applied to the overlap areas and to the isolation area in the isolation area in accordance with an information unit that is to be stored. The memory element can be for a multibit memory cell.

The memory element according to the invention for a semiconductor memory device, in particular, a multibit memory cell or the like, is distinguished in that a number of material areas that are isolated from one another are provided to form the at least one area with changed or changeable electrical and/or magnetic characteristics in the isolation area, and in that the material areas have substantially free charge carriers, and/or free charge carriers can be formed in the material areas.

One basic idea of the present invention is, thus, to simplify and to assist the formation of changed electrical and/or magnetic characteristics in the isolation area by providing a number of material areas in the isolation area, which have free charge carriers and/or in which free charge carriers can be formed. This means that the electrical characteristics or magnetic characteristics can be formed comparatively easily, that is to say, with relatively small electrical potentials in the physically isolated material areas. In the process, local application results in the respectively provided information content also remaining in a local manner in the isolation area. Furthermore, further localization and, hence, avoidance of cross-talk are provided by the isolation of the number of material areas with respect to or from one another, with this isolation being provided, if appropriate, simply by physical separation.

For such a purpose, in accordance with another feature of the invention, the invention advantageously provides for the material areas to be embedded in the isolation area.

In accordance with a further feature of the invention, particularly highly localized structures are obtained if nanodots, or the like, are provided as the material areas. The expression nanodots means very small islands of a material B in a matrix composed of a material A. Alternatively, it is also feasible for a localized area B to be formed within the material A, with this area B having significantly changed electrical characteristics, for example, as a result of severe damage to the material A.

The major characteristic of the material areas in the isolation area is the presence of substantially free charge carriers or the capability to be able to form substantially free charge carriers in the material of the material areas in the isolation area. It is, thus, particularly advantageous for the material areas in the isolation area to have a metal, a semiconductor material, in particular, silicon, germanium and/or the like, possibly in an appropriately doped form, or to be formed from such a material.

In accordance with an added feature of the invention, it is advantageous, but not essential, for the material areas in the isolation area each to be formed substantially identically. This relates both to the geometric characteristics and to the electrical and/or magnetic characteristics of the material areas, and of the material on which these material areas are based.

The material areas in the isolation area may be formed in widely differing ways. For example, it is possible for the material areas of the isolation area to be formed or deposited as material areas that are deposited, but not all the way through, on a first insulator layer of the isolation area, and that are, then, embedded in a second insulator layer of the isolation area. On the other hand, the material areas of the isolation area may also be in the form of implantation regions in the isolation area.

If required, it is possible to carry out heat-treatment at comparatively high temperatures after forming the actual material areas in the isolation area. Accordingly, the corresponding material areas can be further reduced in size by an appropriate oxidation process, in order, in this way, to improve the information localization and the cross-talk behavior further.

In principle, it is feasible for the material areas and, in particular, the nanodots to be formed over the entire isolation area. However, it is particularly advantageous, in accordance with an additional feature of the invention, for the material areas to be formed in regions or areas of the isolation area that are physically isolated from one another and, in particular, in the immediate physical vicinity of the overlap areas of the respective line devices. This means that the isolation area, and the material areas or nanodots provided there, are accessed only in these areas in the immediate physical vicinity of the overlap areas of the respective line devices, thus, allowing local formation, deletion, and/or reading of information contents in the isolation area. These characteristics, in principle, make it possible to form the isolation area with a large number of information units, for example, with n bits.

In accordance with yet another feature of the invention, to control the writing to, deletion, and/or reading from the memory element according to the invention, a control line device is provided that is substantially electrically isolated from the line devices, and control potential distribution can be applied locally or globally to the isolation area by the control line device. Such a measure improves the influence of, and/or increases the possibility of influencing the formation, changing, and/or sampling of the electrical and/or magnetic characteristics of the material areas of the isolation area.

In accordance with yet a further feature of the invention, the line devices and, in particular, the overlap areas between them each to form a field effect transistor element in pairs with that section of the intermediate area that is respectively provided between them. The invention furthermore provides, in this case, for this element combination, as a field effect transistor element, to respectively be controllable by the control line device as the gate connection and the isolation area as the gate insulation.

In accordance with yet an added feature of the invention, it is particularly advantageous for the areas whose electrical and/or magnetic characteristics can be varied to respectively be formed by a cohesive group of material areas, and, in particular, by a cohesive group of nanodots. This further improves the localization of the information units, and, hence, the cross-talk.

In accordance with yet an additional feature of the invention, the invention provides, in particular, for one area of the isolation area to be formed, in each case, for storage of one information unit, that is to say, for example, of one bit.

In accordance with a concomitant feature of the invention, the processes of writing to, deletion, and/or reading of the information contents or units is particularly advantageous if the areas can be written to, read from, and/or deleted by high-energy or hot charge carriers with respect to the information unit.

The invention will be explained in more detail in the following text.

More bits per cell can be stored in flash memory cells because different charge states are stored or because one bit is respectively stored at physically separate locations.

For the purposes of the invention, an alternative cell concept is proposed for storage of two or more bits at different locations in one memory cell.

Until now, it has been possible to store two bits in one flash cell either by using silicon spacer technology or by using a $Si_3N_4$ layer in the NROM concept.

Instead of a floating gate all the way through, silicon nanocrystals, which are embedded in a silicon dioxide matrix, are used for storing charge according to the invention. These are normally programmed and deleted by direct tunnels or by Fowler-Nordheim tunnels.

If a cell such as this is programmed using hot electrons, then independent programming can be achieved at both ends of the cell and, for example, it is possible to store two bits per cell.

In contrast to the NROM concept, in which silicon nitride is used as the memory layer, such a configuration results in an additional degree of freedom due to the choice of the silicon nanodots. If the size of and separation between the dots are selected appropriately, the lateral charge loss can, thus, be minimized.

A number of methods are feasible for producing and, hence, for selecting the size and density of the silicon nanodots. First of all, once a thin oxide has been produced, a silicon layer that does not pass all the way through can be deposited, and can then be covered with a further silicon oxide layer.

The density and the size of the silicon dots are selected by suitable choice of the deposition conditions for the silicon deposition. Alternatively, the entire silicon dioxide layer can be applied, and the silicon islands can then be produced by silicon implantation—the implantation of a different semiconductor, for example, of germanium, is also feasible as an alternative. The position and orientation and size and density of silicon dots are selected, for example, by the appropriate energy, dose, and ion flow for the implantation, and by the conditions in the subsequent heat treatment. In both production versions, the size of the silicon dots is reduced, thus, achieving fine-tuning, by subsequent thermal oxidation at a low temperature.

The inventive ideas lie in the combination of flash memory cells with silicon nanodots with the programming and deletion method using hot electrons or using hot holes. If, the silicon dots can be produced only at the source ends and drain ends of the component, deletion from the silicon dots is alternatively also possible by Fowler-Nordheim tunnels.

A further idea is to select the density and size of the nanodots to minimize the lateral charge loss and the non-uniform charging of the dots during writing and deletion.

As has already been mentioned, the memory elements according to the invention are programmed by hot charge carriers, in particular, electrons, and are deleted by hot holes. The stored information in the respective memory elements is read in the opposite direction to programming (reverse read)

The following table illustrates, by way of example, the potential ratios for two-bit cells to be applied during writing, deletion, and/or reading:

|  | S/D connection 1 | S/D connection 2 | Control Gate |
|---|---|---|---|
| Program bit #1 | 0 V | approx. 4–6 V | approx. 9 V |
| Program bit #2 | approx. 4–6 V | 0 V | approx. 9 V |
| Read bit #1 | approx. 1–2 V | 0 V | approx. 2–3 V |
| Read bit #2 | 0 V | approx. 1–2 V | approx. 2–3 V |
| Delete bit #1 | floating | approx. 9 V | 0 V |
| Delete bit #2 | approx. 9 V | floating | 0 V |
| Alternatively |  |  |  |
| Delete bit #1 | floating | approx. 5 V | −5 V |
| Delete bit #2 | approx. 5 V | floating | −5 V |

Other features that are considered as characteristic for the invention are set forth in the appended claims.

Although the invention is illustrated and described herein as embodied in a memory element for a semiconductor memory device, it is, nevertheless, not intended to be limited to the details shown because various modifications and structural changes may be made therein without departing from the spirit of the invention and within the scope and range of equivalents of the claims.

The construction and method of operation of the invention, however, together with additional objects and advantages thereof, will be best understood from the following description of specific embodiments when read in connection with the accompanying drawings.

DESCRIPTION OF THE PREFERRED EMBODIMENTS

Figure 1:
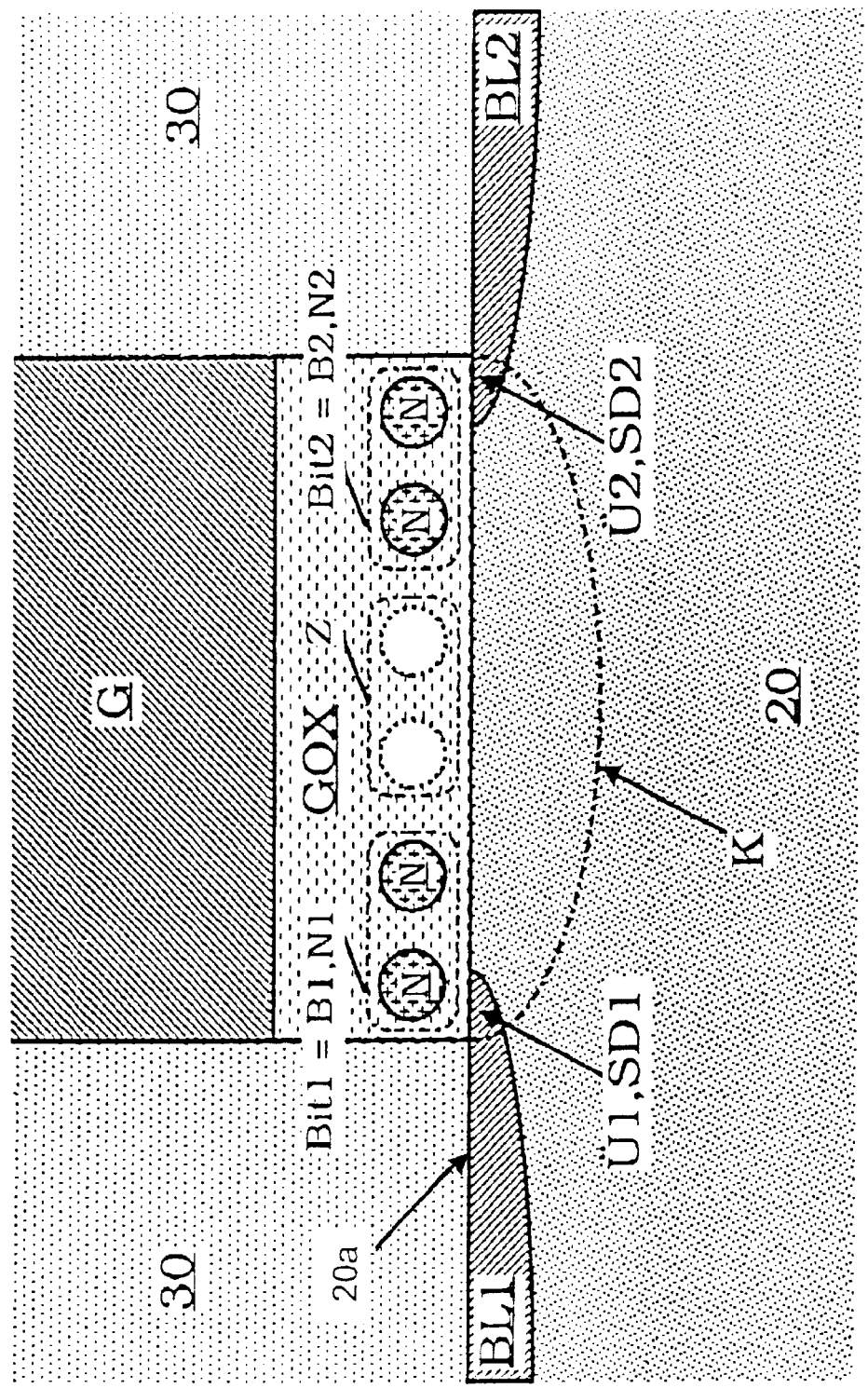
FIG. 1 is a fragmentary, cross-sectional view of an embodiment of the memory element according to the invention.

Referring now to the figures of the drawings in detail and first, particularly to FIG. 1 thereof, there is shown, in a schematic and side cross-sectional view, a first embodiment of a memory element 1 according to the invention.

A first line device BL1 with an end area SD1 is formed in the area of a surface 20a in a semiconductor substrate 20 with the surface area 20a. A second line device BL2, with an end area SD2 that is opposite the first end area SD1 of the first line device BL1, is provided in the surface area 20a of the semiconductor substrate 20, separated physically and by material with an intermediate area K from the end area SD1 of the first line device BL1.

The actual isolation area GOX is formed above the intermediate area K, and, thus, above the surface area 20a of the semiconductor substrate 20. A number of material areas N are respectively provided in the isolation area GOX, adjacent to the end areas SD1 and SD2, respectively, of the first and second line devices BL1, BL2, the electrical and/or magnetic characteristics of these material areas N can be varied, and, in particular, they are in the form of so-called nanodots.

A control connection line G that is, itself, embedded in an isolation area 30, is formed on the side of the isolation area GOX facing away from the end areas SD1, SD2 of the first and second line devices BL1, BL2.

The configuration illustrated in FIG. 1 results in the end areas SD1, SD2 of the first line device BL1 and of the second line device BL2 (which are separated from one another physically and by material by the intermediate area K of the semiconductor substrate 20) forming source/drain areas SD1, SD2 as overlap areas Ü1, Ü2 with respect to the isolation area GOX, which is used as a gate isolation area or gate oxide. The control line device G, thus, acts as a gate connection.

Although, in principle, the entire isolation area GOX can be formed using nanodots N, only two areas B1 and B2 in the isolation area GOX are each provided with nanodots N in the embodiment shown in FIG. 1, and are used to form corresponding, cohesive nanodot regions or groups N1, N2. Dotted circles in the central area Z of the isolation area GOX indicate further nanodots N.

The information contents in the isolation area GOX can be appropriately programmed or written to, deleted, and/or read from by appropriate application of a potential distribution to the line devices BL1, BL2, and G, respectively, as the first and second source/drain connections and as the gate connection. In such a case, the regions B1 and B2 each act as a memory area for one bit, namely for a bit 1 and for a bit 2. The above description of the writing, deletion, and/or reading processes relates to the configuration shown in FIG. 1.

Figure 2:
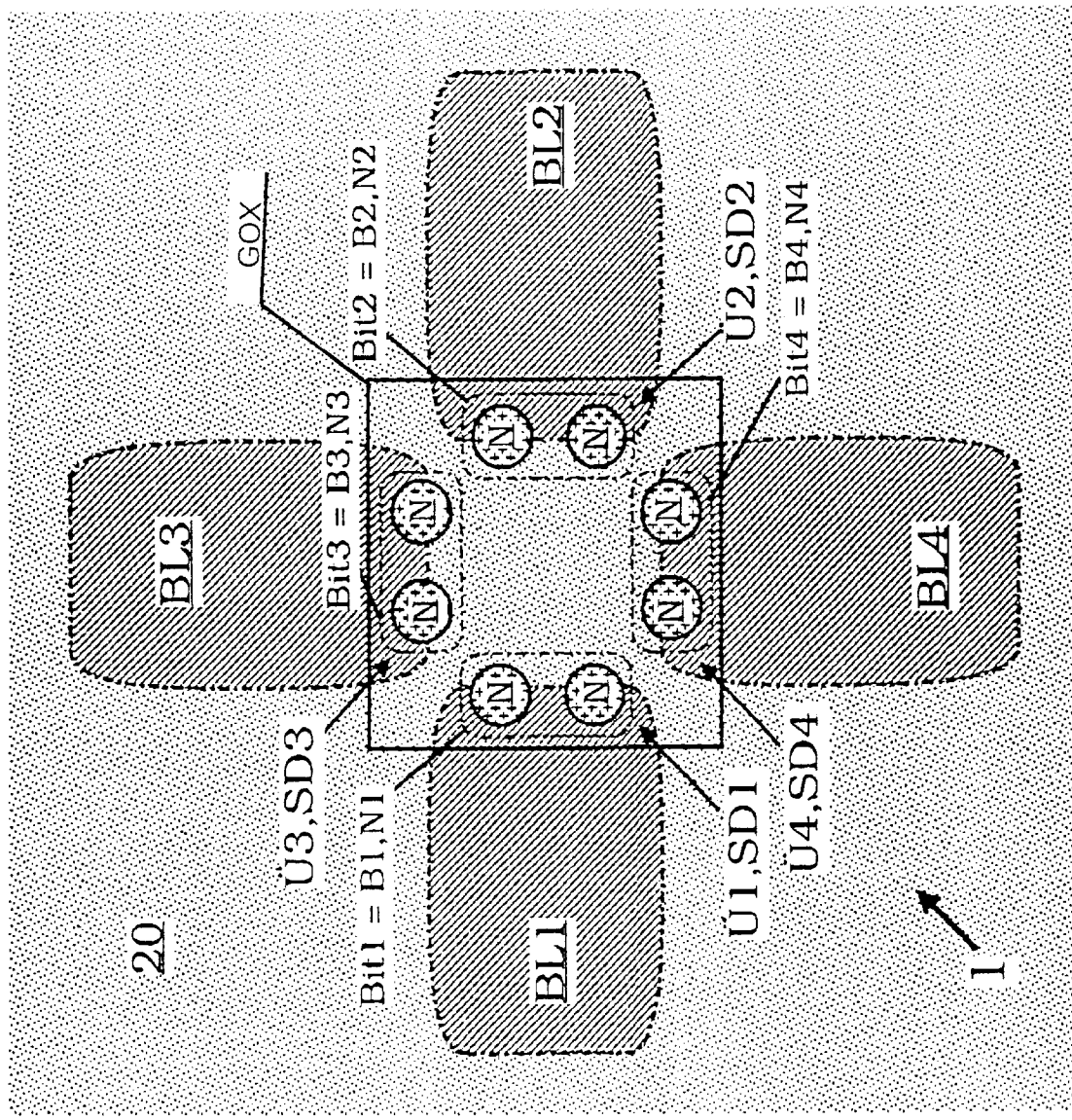
FIG. 2 is a fragmentary, plan view of another embodiment of the memory element according to the invention.

FIG. 2 shows a plan view of another embodiment of a memory element 1 according to the invention.

The control line device G, that is to say, the gate connection, is omitted in the view in FIG. 2. The figure shows the outline of a square isolation area GOX. The isolation area GOX is accessed by four line devices BL1, . . . , BL4. The overlap areas Ü1, . . . , Ü4 or source/drain areas SD1, . . . , SD4 of the line devices BL1, . . . , BL4 are represented by dashed-dotted lines on the edge of the isolation area GOX that overlap with corresponding nanodot regions N1, . . . , N4 each of a number of nanodots N, with the nanodots N being used as areas B1, . . . , B4 whose electrical and/or magnetic characteristics can be varied and that are themselves suitable for storage of four individual bits, Bit1 to Bit4.

In principle, other configurations with a number of line devices BL1, . . . , BLn are also feasible, with n being the number of line devices or bit lines. In other words, the most preferred exemplary embodiment of the invention is based on a memory cell with two line devices or connections. However, in general, n line devices BL1, . . . , BLn are also possible, where n is $\geq 2$ and n may assume the value 4, purely by way of example, or any other magnitude.

Also, the memory elements 1 of FIGS. 1 and 2 can be one element in an array having many of such elements.

I claim:

1. A memory element for a semiconductor memory device, comprising:
   a semiconductor substrate of a first conductance type having:
      a surface area;
      an intermediate area; and
      a number of line devices formed one of in said semiconductor substrate and in said surface area, said line devices substantially electrically insulated from one another in pairs and at least partially formed and disposed physically separated from one another in pairs by said intermediate area;

an isolation area of an substantially electrically insulating material, said isolation area mechanically and electrically contacted with:
said intermediate area; and
each of said line devices at a respective overlap area of each of said line devices;
said isolation area having a number of material areas isolated from one another to form at least one area with at least one of changed electrical characteristics and changed magnetic characteristics in said isolation area, at least one of:
each of said material areas having free charge carriers; and
each of said material areas being able to have free charge carriers formed therein; and
said line devices and said isolation area at least temporarily forming said at least one area when an electrical potential distribution is applied to said line devices and to said isolation area in said isolation area in accordance with an information unit that is to be stored.

2. The memory element according to claim 1, wherein said material areas are embedded in said isolation area.

3. The memory element according to claim 1, wherein said material areas are nanodots.

4. The memory element according to claim 1, wherein said material areas have at least one of a metal and a semiconductor material.

5. The memory element according to claim 4, wherein said metal and said semiconductor material are selected from the group consisting of silicon, germanium, doped silicon, and doped germanium.

6. The memory element according to claim 1, wherein said material areas of at least one of a metal and a semiconductor material.

7. The memory element according to claim 6, wherein said metal and said semiconductor material are selected from the group consisting of silicon, germanium, doped silicon, and doped germanium.

8. The memory element according to claim 1, wherein said material areas are substantially identical.

9. The memory element according to claim 1, wherein said material areas are formed substantially identically.

10. The memory element according to claim 1, including a first isolator layer and a second isolator layer, said material areas being at least partially deposited through said first isolator layer and then embedded in said second isolator layer.

11. The memory element according to claim 1, wherein said material areas are implantation regions in said isolation area.

12. The memory element according to claim 1, wherein said material areas are formed in regions of said isolation area physically isolated from one another.

13. The memory element according to claim 1, wherein said material areas are formed in an immediate physical vicinity of said overlap area of a respective one of said line devices.

14. The memory element according to claim 1, wherein said material areas are immediately adjacent said overlap area of a respective one of said line devices.

15. The memory element according to claim 1, including a control line device substantially electrically isolated from said line devices, said control line device applying a control potential distribution one of locally and globally to said isolation area.

16. The memory element according to claim 15, wherein:
said intermediate area has sections; and
said line devices each form a field effect transistor element in pairs with said sections of said intermediate area respectively between each of said field effect transistor element, said field effect transistor element respectively controlled by said control line device as a gate connection and said isolation area as a gate insulation.

17. The memory element according to claim 15, wherein:
said intermediate area has sections; and
said overlap areas each form a field effect transistor element in pairs with said sections of said intermediate area respectively between each of said field effect transistor element, said field effect transistor element respectively controlled by said control line device as a gate connection and said isolation area as a gate insulation.

18. The memory element according to claim 1, wherein:
said at least one area is a plurality of areas; and
said areas are respectively formed by a cohesive group of said material areas of said isolation area.

19. The memory element according to claim 1, wherein:
said at least one area is a plurality of areas; and
said areas are respectively formed by nanodots.

20. The memory element according to claim 1, wherein:
said at least one area is a plurality of areas; and
said areas are each adapted to store one information unit.

21. The memory element according to claim 1, wherein:
said at least one area is a plurality of areas; and
said areas are each adapted to store one bit.

22. The memory element according to claim 20, wherein said areas are at least one of writable, deleteable, and readable with respect to said information unit by one of high-energy carriers and hot charge carriers.

23. The memory element according to claim 20, wherein said areas are adapted to be written to, deleted, and read from with respect to said information unit by one of high-energy carriers and hot charge carriers.

24. A memory element for a semiconductor memory device, comprising:
a semiconductor substrate of a first conductance type having:
a surface area;
an intermediate area; and
a number of line devices formed one of in said semiconductor substrate and in said surface area, said line devices substantially electrically insulated from one another in pairs and at least partially formed and disposed physically separated from one another in pairs by said intermediate area;
an isolation area of an substantially electrically insulating material, said isolation area mechanically and electrically contacted with:
said intermediate area; and
each of said line devices at a respective overlap area of each of said line devices;
said isolation area having a number of material areas isolated from one another to form at least one area with at least one of changed electrical characteristics and changed magnetic characteristics in said isolation area, at least one of:
each of said material areas having free charge carriers; and
each of said material areas being able to have free charge carriers formed therein; and said overlap areas and said isolation area at least temporarily forming said at least one area when an electrical potential distribution is applied to said overlap areas and to said isolation area in said isolation area in accordance with an information unit that is to be stored.

25. A memory element for a multibit memory cell, comprising:

a semiconductor substrate of a first conductance type having:
   a surface area;
   an intermediate area; and
   a number of line devices formed one of in said semiconductor substrate and in said surface area, said line devices substantially electrically insulated from one another in pairs and at least partially formed and disposed physically separated from one another in pairs by said intermediate area;

an isolation area of an substantially electrically insulating material, said isolation area mechanically and electrically contacted with:
   said intermediate area; and
   each of said line devices at a respective overlap area of each of said line devices;

said isolation area having a number of material areas isolated from one another to form at least one area with at least one of changed electrical characteristics and changed magnetic characteristics in said isolation area, at least one of:
   each of said material areas having free charge carriers; and
   each of said material areas being able to have free charge carriers formed therein; and said overlap areas and said isolation area at least temporarily forming said at least one area when an electrical potential distribution is applied to said overlap areas and to said isolation area in said isolation area in accordance with an information unit that is to be stored.

26. A memory element for a multibit memory cell, comprising:

a semiconductor substrate of a first conductance type having:
   a surface area;
   an intermediate area; and
   a number of line devices formed one of in said semiconductor substrate and in said surface area, said line devices substantially electrically insulated from one another in pairs and at least partially formed and disposed physically separated from one another in pairs by said intermediate area;

an isolation area of an substantially electrically insulating material, said isolation area mechanically and electrically contacted with:
   said intermediate area; and
   each of said line devices at a respective overlap area of each of said line devices;

said isolation area having a number of material areas isolated from one another to form at least one area with at least one of changed electrical characteristics and changed magnetic characteristics in said isolation area, at least one of:
   each of said material areas having free charge carriers; and
   each of said material areas being able to have free charge carriers formed therein; and said line devices and said isolation area at least temporarily forming said at least one area when an electrical potential distribution is applied to said line devices and to said isolation area in said isolation area in accordance with an information unit that is to be stored.

* * * * *